(12) United States Patent
Hirase et al.

(10) Patent No.: US 7,045,434 B2
(45) Date of Patent: May 16, 2006

(54) SEMICONDUCTOR DEVICE AND METHOD FOR MANUFACTURING THE SAME

(75) Inventors: Masaki Hirase, Gifu-ken (JP); Satoru Shimada, Gifu-ken (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/908,941

(22) Filed: Jul. 20, 2001

(65) Prior Publication Data

US 2002/0030290 A1    Mar. 14, 2002

(30) Foreign Application Priority Data

Jul. 24, 2000    (JP)    ............................. 2000-223125

(51) Int. Cl.
*H01L 21/76*    (2006.01)

(52) U.S. Cl. ...................... 438/401; 438/975; 257/797

(58) Field of Classification Search ................ 438/401, 438/975; 257/797
See application file for complete search history.

(56) References Cited

U.S. PATENT DOCUMENTS

| | | | | |
|---|---|---|---|---|
| 4,737,468 A | * | 4/1988 | Martin | ........................ 438/504 |
| 5,733,801 A | * | 3/1998 | Gojohbori | ................... 438/401 |
| 5,889,335 A | * | 3/1999 | Kuroi et al. | ................. 257/797 |
| 5,968,610 A | * | 10/1999 | Liu et al. | ..................... 427/579 |
| 6,033,970 A | * | 3/2000 | Park | ........................... 438/435 |
| 6,087,208 A | * | 7/2000 | Krivokapic et al. | ......... 438/183 |
| 6,127,245 A | * | 10/2000 | Schoenfeld | .................. 438/460 |
| 6,181,018 B1 | * | 1/2001 | Saino | ......................... 257/647 |
| 6,303,458 B1 | * | 10/2001 | Zhang et al. | ................ 438/401 |
| 6,368,937 B1 | * | 4/2002 | Nakamura | ................... 438/401 |

FOREIGN PATENT DOCUMENTS

| | | |
|---|---|---|
| JP | 11-67620 | 3/1999 |
| JP | 11-135404 | 5/1999 |
| JP | 2001-52993 | 2/2001 |
| JP | 2001-338974 | 12/2001 |

OTHER PUBLICATIONS

Wolf et al., Silicon Processing for the VLSI Era, vol. 1- Process Technology, 1986, Lattice Press, p. 1.*

* cited by examiner

*Primary Examiner*—Jennifer Kennedy
(74) *Attorney, Agent, or Firm*—Armstrong, Kratz, Quintos, Hanson & Brooks, LLP

(57) ABSTRACT

A method for manufacturing a semiconductor substrate including a mask aligning trench. The method includes forming the mask aligning trench and an element partitioning trench. The element partitioning and mask aligning trenches are filled with insulation. The insulation in the element partitioning trench is masked and the insulation in the mask aligning trench is etched. As a result, a residue of the insulation in the mask aligning trench is below the upper edge of the mask aligning trench. The mask aligning trench is easily detected. Thus, positioning a patterning mask on the substrate can be performed accurately.

12 Claims, 3 Drawing Sheets

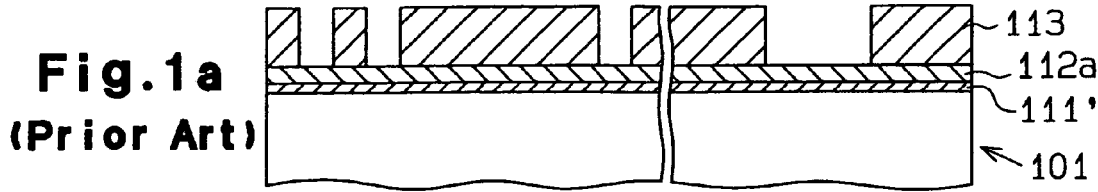
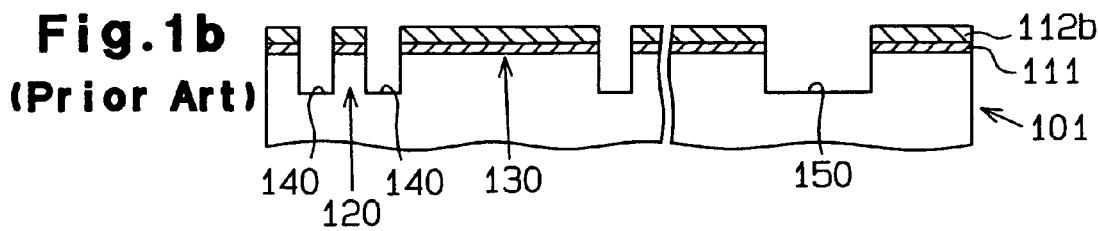
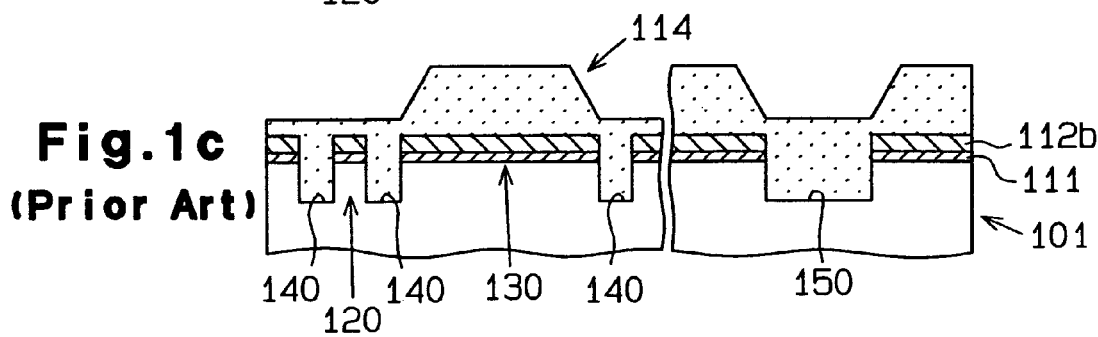
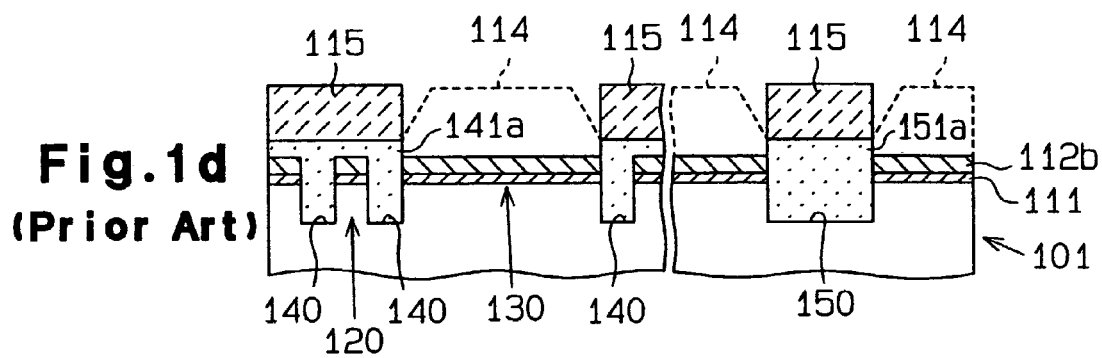
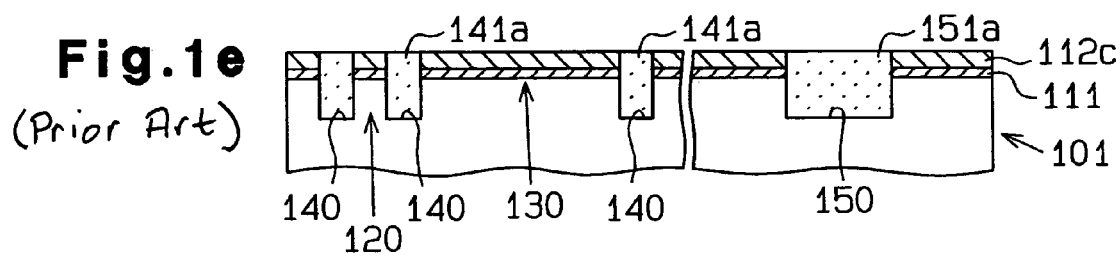
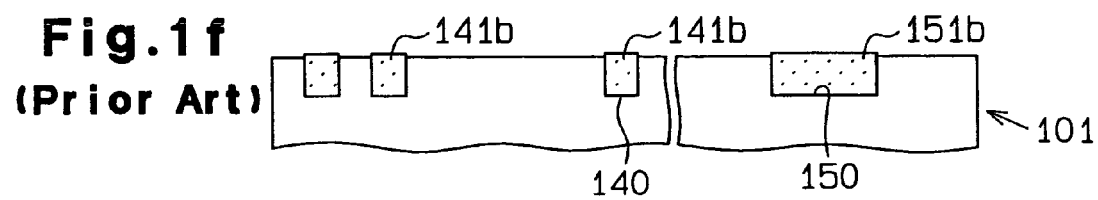

SEMICONDUCTOR DEVICE AND METHOD FOR MANUFACTURING THE SAME

BACKGROUND OF THE INVENTION

The present invention relates to a semiconductor device and a method for manufacturing the same, and more particularly, to a semiconductor device provided with an alignment mark (mask aligning trench) used to position a photomask.

In a process for manufacturing a finely miniaturized or highly integrated semiconductor device, especially when performing photolithography, it is important that a photomask be accurately applied to an existing pattern to form the next pattern. Japanese Unexamined Patent Publication No. 11-67620 describes a method of positioning the photomask. In the publication, an alignment mark (mask aligning trench) is formed on a substrate and detected to position a photomask. Normally, the alignment mark is used only to position the photomask.

A prior art semiconductor device has an element partitioning structure that includes an insulative element partitioning film formed through local oxidation of silicon (LOCOS). When patterning a conductive film on a semiconductor substrate having an insulative element partitioning film, a step formed between the insulative element partitioning film and an element forming section functions as the alignment mark. In this case, the step is used to position a photomask on the semiconductor substrate. Thus, an additional process for forming the alignment mark is not necessary.

Due to the further miniaturization and higher integration of recent semiconductor devices, shallow trench isolation (STI) is now being performed in lieu of LOCOS to form an element partitioning structure. However, when forming an alignment mark, STI has the shortcomings described below. Referring to FIGS. 1a to 1f, a process for forming an element partitioning trench through STI will be discussed to understand these shortcomings.

Referring to FIG. 1a, when performing STI, prior to the formation of element partitioning trenches, a silicon oxide film 111' is applied to a semiconductor substrate 101 and a silicon nitride film 112a is superimposed on the silicon oxide film 111'. Then, lithography is performed to form a resist 113 having a predetermined pattern, which is a pattern of openings used to form the element partitioning trenches.

Subsequently, referring to FIG. 1b, anisotropic etching is performed to etch the silicon nitride film 112a using the resist 113 as a mask. As a result, portions corresponding to the element partitioning trenches are removed from the silicon nitride film 112a thereby defining a silicon nitride film 112b. Anisotropic etching is then performed on the silicon oxide film 111' and the semiconductor substrate 101 using the silicon nitride film 112b as a mask. This forms element partitioning trenches 140 and a mask aligning trench 150, which is used as an alignment mark, on the semiconductor substrate 101. The element partitioning trenches 140 define element forming sections 120, 130.

Referring to FIG. 1c, high density plasma chemical deposition (HDP-CVD) is performed to form a silicon oxide film 114. The silicon oxide film 114 has recesses formed at portions corresponding to the trenches 140, 150.

Referring to FIG. 1d, lithography is performed to form a resist 115 in the recesses of the silicon oxide film 114. Then, the silicon oxide film 114 is partially etched and removed using the resist 115 as a mask. The step shown in FIG. 1d facilitates flattening (described later) of the surface of the semiconductor substrate 101 when undergoing chemical mechanical polish (CMP). CMP is described in *A novel approach for the elimination of the pattern density dependence of CMP for shallow trench isolation*, Joost Grillaert et al., CMP-MIC, pp. 313–318, 1998.

Subsequent to the partial removal of the silicon oxide film 114, referring to FIG. 1e, the resist 115 is removed. When performing CMP, the silicon nitride film 112b is used as a stopper film to grind and flatten the silicon oxide film 114 and the silicon nitride film 112b. As a result, the surface of the ground silicon nitride film 112c, the surface of a silicon oxide film 141a implanted in the element partitioning trench 140, and the surface of a silicon oxide film 151a implanted in the mask aligning trench 150 are flush with one another.

The ground silicon nitride film 112c is selectively removed using hot phosphoric acid. The silicon oxide film 211 is then removed by hydrofluoric acid. As a result, element partitions 141b and a mask aligning section 151b are defined on the semiconductor substrate 101. The element partitions 141b and the mask aligning section 151b are formed by the residue of the silicon oxide films 141a, 151a subsequent to the removal of the silicon nitride film 112c and the silicon oxide film 111.

After the formation of the element partitions 141b and the mask aligning section 151b, in accordance with the type of semiconductor device that is to be manufactured, the semiconductor substrate 101 undergoes a washing process and/or an ion implantation process. Then, for example, a conductive film is patterned on the semiconductor substrate 101. When the conductive film is formed through photolithography, the step defined by the mask aligning section 151b and the semiconductor substrate 101 is detected. The step is used as a mark indicating where to position a mask, which is used to form the conductive film pattern, relative to the element forming sections of the semiconductor substrate 101.

During the manufacturing of a semiconductor device in the prior art, when the step between the mask aligning section (mask aligning trench) 151b and the semiconductor substrate 101 is too small, it becomes difficult to accurately detect the step. As a result, the positioning of a mask becomes difficult.

However, it is preferred that the step between the element partitions 141b and the element forming sections be minimized for the miniaturization of a semiconductor device. This is because the focus margin during photolithography becomes smaller as the semiconductor device becomes smaller, and the underlying film is required to have a higher level of flatness to produce patterns with the necessary accuracy.

In the conventional method for manufacturing a semiconductor device, the element partition and the mask aligning section are simultaneously formed. However, these two sections basically have the same structure. Thus, it is difficult to satisfy the two contradicting requirements. Further, an additional process for forming the alignment mark would increase manufacturing costs, which is not desirable.

BRIEF SUMMARY OF THE INVENTION

It is an object of the present invention to provide a relatively inexpensive method for manufacturing a semiconductor device that has an element partitioning trench and an element forming section and facilitates the positioning of a mask.

To achieve the above object, the present invention provides a semiconductor device provided with a semiconductor substrate including an element partitioning trench and a mask aligning trench. A first insulation is deposited in the element partitioning trench, and a second insulation is partially deposited in the mask aligning trench formed from the same substance as the first insulation.

A further perspective of the present invention is a method for manufacturing a semiconductor device. The method includes forming an element partitioning trench and a mask aligning trench in a semiconductor substrate, depositing an insulation in the element partitioning trench and the mask aligning trench, applying a protective mask on the insulation deposited in the element partitioning trench, etching the insulation deposited in the mask aligning trench to remove some of the insulation, and flattening an upper surface of the semiconductor substrate.

A further perspective of the present invention is a method for manufacturing a semiconductor device. The method includes forming a silicon oxide film on an upper surface of a semiconductor substrate, forming a silicon nitride film on the silicon oxide film, partially removing the silicon nitride film and the silicon oxide film, and forming an element partitioning trench and a mask aligning trench by etching the semiconductor substrate using a residue of the silicon nitride and silicon oxide films as a mask. The element partitioning trench and the mask aligning trench have substantially the same depths. The method further includes simultaneously depositing a first layer of insulation and a second layer of insulation in the element partitioning trench and in the mask aligning trench, respectively, coating the first insulation with a protective mask, etching the second insulation so that a step is formed between an upper surface of the semiconductor substrate and an upper surface of the second insulation, and removing the protective mask.

Other aspects and advantages of the present invention will become apparent from the following description, taken in conjunction with the accompanying drawings, illustrating by way of example the principles of the invention.

BRIEF DESCRIPTION OF THE SEVERAL VIEWS OF THE DRAWINGS

The invention, together with objects and advantages thereof, may best be understood by reference to the following description of the presently preferred embodiments together with the accompanying drawings in which:

FIGS. 1a to 1f are cross-sectional views illustrating a process for manufacturing a prior art semiconductor device;

DETAILED DESCRIPTION OF THE PREFERRED EMBODIMENTS

A semiconductor device 10 according to a preferred embodiment of the present invention will now be discussed. The semiconductor device 10 is a metal oxide semiconductor (MOS) transistor.

Figure 2:
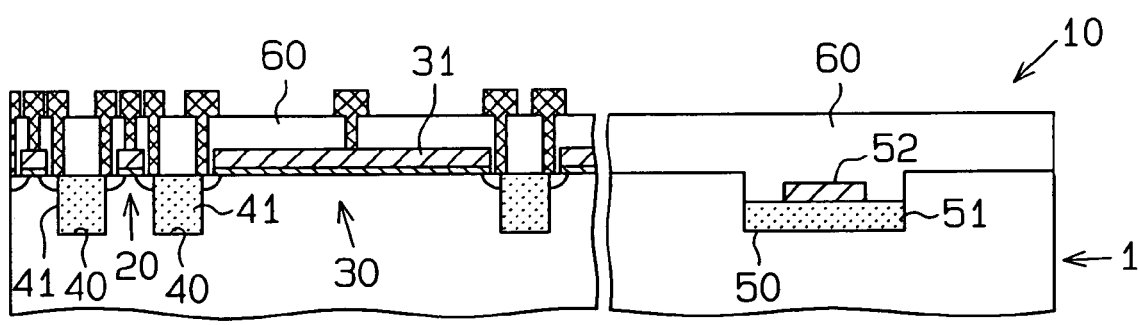
FIG. 2 is a cross-sectional view showing a semiconductor device according to a preferred embodiment of the present invention.

FIG. 2 is a cross-sectional view showing the semiconductor device 10. The semiconductor device 10 includes a semiconductor substrate 1 made of silicon. Element forming sections 20, 30 are defined on the semiconductor substrate 1. The element forming sections 20, 30 are partitioned from each other by element partitioning trenches 40 and insulation layers 41, which are formed of silicon oxide ($SiO_2$) and arranged in the element partitioning trenches 40. An interlayer insulation film 60 is applied to the elements formed on the element forming sections 20, 30.

A mask aligning trench 50 is formed in the semiconductor substrate 1. An insulation layer 51, which is made of the same silicon oxide as the insulation layers 41 in the element partitioning trenches 40, is formed in the mask aligning trench 50. The mask aligning trench 50 is partially filled by the insulation layer 51. In other words, the upper surface of the insulation layer 51 is below the upper edge of the mask aligning trench 50, and a step is defined by the upper surface of the insulation layer 51 and the upper edge of the mask aligning trench 50. In the preferred embodiment, element partitions are defined by the element partitioning trenches 40 and the insulation layers 41.

Subsequent to the formation of the element partitions, conductive films, such as a gate electrode 31, are formed on the semiconductor substrate 1. In this state, a step defined between the insulation layer 51 and the upper edge of the mask aligning trench 50 is used as a mark indicating where to position a mask, which is used to form the gate electrode 31, on the semiconductor substrate 1.

A film 52, which is made, for example, from the same substance as the gate electrode, is formed on the insulation layer 51.

A method for manufacturing the semiconductor device 10 in the preferred embodiment will now be discussed.

Figure 3A:
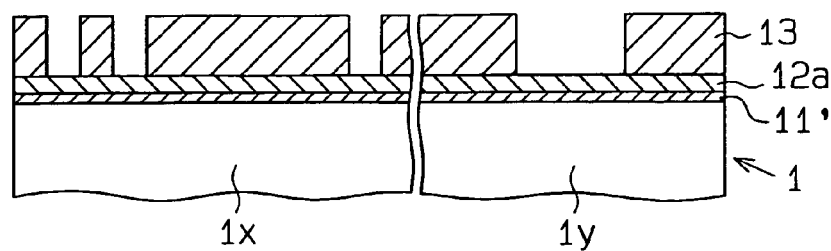
FIGS. 3a to 3f are cross-sectional views illustrating a process for manufacturing the semiconductor device of FIG. 2.

Referring to FIG. 3a, thermal oxidation is performed under a temperature of 950 degrees Celsius in an atmosphere of dry oxygen to form a silicon oxide film 11' on the upper surface of the semiconductor substrate 1. The preferred thickness of the silicon oxide film 11' is 20 nm. Then, decompression CVD is performed to form a silicon nitride film 12a, the thickness of which is preferably about 200 nm under the following conditions of:

temperature, 770° C.;
pressure, 66.5Pa;
flow rate of $SI_2Cl_2H_2$ gas, $1.2\times10^{-4}m^3$/min (standard state); and
flow rate of $NH_3$ gas, $1.2\times10^{-3}m^3$/min (standard state).

Then, lithography is performed to pattern a resist 13.

Subsequently, magnetron reactive ion etching (RIE) is performed using the resist 13 as a mask to etch the silicon nitride film 12a and the silicon oxide film 11' under the following conditions of:

pressure, 5.32 Pa;
RF (13.56Hz) power, 600 W;
magnetic field, 60 Gauss;
flow rate of $CHF_3$, $4.0\times10^{-5}m^3$/min (standard state);
flow rate of $O_2$, $5\times10^{-6}m^3$/min (standard state); and
flow rate of Ar, $3\times10^{-5}m^3$/min (standard state).

This forms a silicon nitride film 12b and a silicon oxide film 11, which have a pattern of openings corresponding to the element partitioning trenches 40 and the mask aligning trench 50.

The resist 13 is removed by an aqueous solution of sulfuric acid and hydrogen peroxide. Then, magnetron RIE is performed using the silicon nitride film 12b as a mask under the following conditions of:

pressure, 3.99 Pa;
RF (13.56Hz) power, 450 W;
magnetic field, 25 Gauss;
flow rate of HBr, $1.0\times10^{-5}m^3$/min (standard state);
flow rate of $O_2$, $8.0\times10^{-6}m^3$/min (standard state); and
flow rate of $NF_3$, $1.5\times10^{-5}m^3$/min (standard state)

Figure 3B:
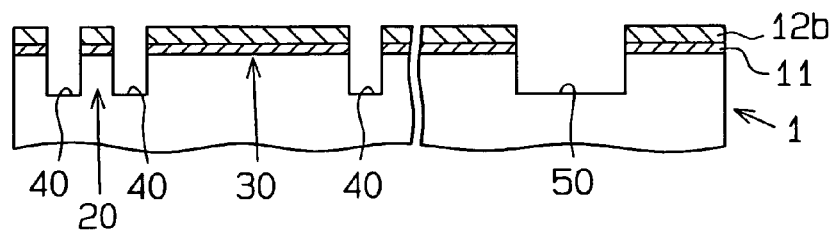

This forms the element partitioning trenches 40 and the mask aligning trench 50 on the semiconductor substrate 1, as shown in FIG. 3b. It is preferred that the depths of the element partitioning trenches 40 and the mask aligning trench 50 be about 350 nm.

Figure 3C:
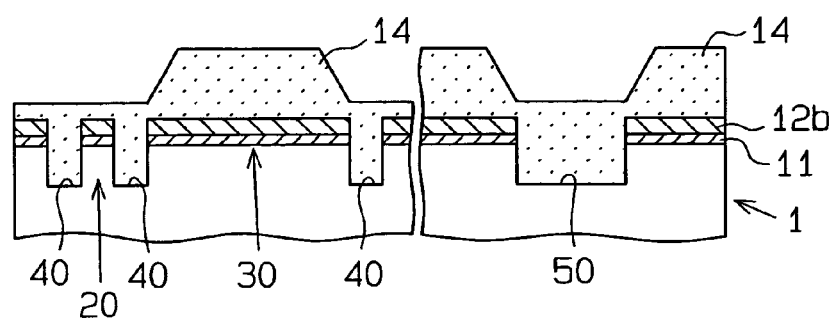

Then, referring to FIG. 3c, a silicon oxide film 14 is deposited on the entire surface of the semiconductor substrate 1. It is preferred that the thickness of the silicon oxide film 14 be about 600 nm. Further, it is preferred that the silicon oxide film 14 be deposited by performing HDP-CVD under the following conditions of:

LF (350kHz) power, 2,850 W;
HF (13.56Hz) power, 1,800 W;
flow rate of $SiH_4$, $8.0 \times 10^{-5} m^3/min$ (standard state);
flow rate of $O_2$, $1.5 \times 10^{-4} m^3/min$ (standard state); and
flow rate of Ar, $5.0 \times 10^{-5} m^3/min$ (standard state).

A resist 15 for masking the element partitioning trenches 40 is then formed. Lithography is performed to etch about 400 nm of a first portion of the silicon oxide film 14, which covers the mask aligning trench 50, and a second portion of the silicon oxide film 14, which extends from the semiconductor substrate 1 over a relatively large area. Magnetron RIE is performed to etch the silicon oxide film 14 under the same conditions of the etching of the silicon nitride film 12a in the state of FIG. 3b. As a result, residue of the silicon oxide film 14 is left in the mask aligning trench 50. The residue is below the top edge of the mask aligning trench 50. Further, the etching of the second portion of the silicon oxide film 14 forms a relatively thin insulation film 14'. This facilitates the flattening of the semiconductor substrate 1.

The resist 15 is removed by an aqueous solution of sulfuric acid and hydrogen peroxide. The silicon nitride film 12b is used as a stopper to flatten the upper surface of the semiconductor substrate 1 through CMP. When flattening the semiconductor substrate 1, the relative rotating speed between a grinding pad and the substrate is about 30rpm, and the contact pressure between the grinding pad and the substrate 1, or the grinding pressure is about $4.9 \times 10^3 kg/m^2$. It is preferred that the thickness of the flattened silicon nitride film 12c be about 100 nm. In the state of FIG. 3e, the upper surfaces of the insulation layers (silicon oxide film) 41a are flush with the upper surface of the silicon nitride film 12c.

Figure 3D:
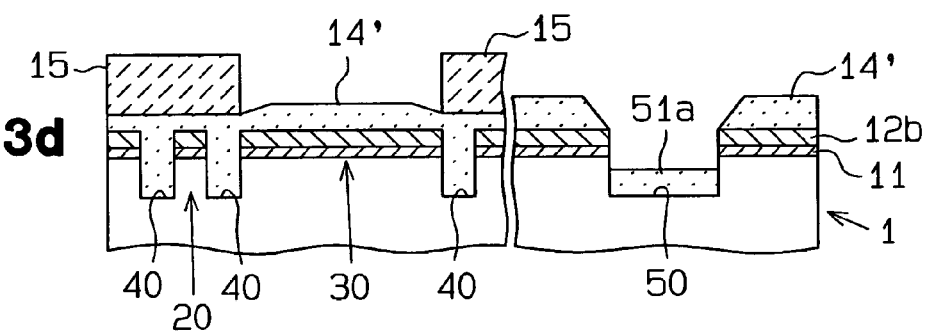
Figure 3E:
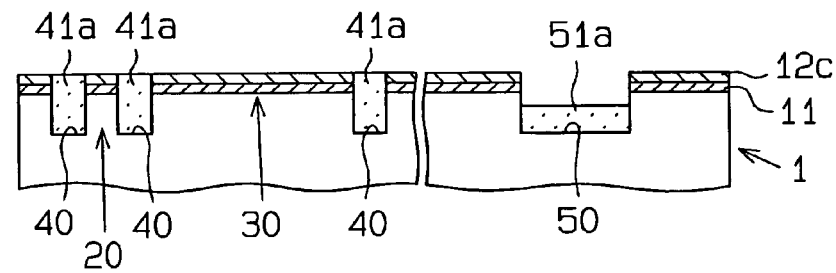
Figure 3F:
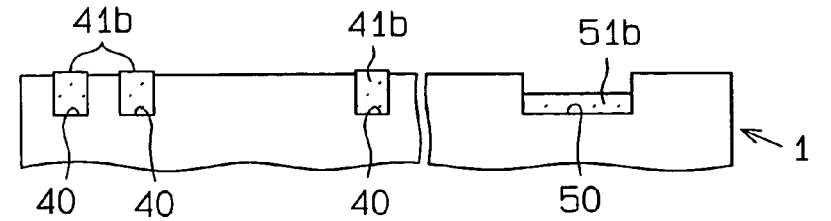

Referring to FIG. 3f, hot phosphoric acid is used to selectively remove the flattened silicon nitride film 12c, and hydrofluoric acid is used to remove the silicon oxide film 11. The thickness of the silicon nitride film 12c is about 100 nm. Thus, subsequent to the removal of the silicon nitride film 12c, the insulation layers 41a extend from the surfaces of the element forming sections 20, 30 by about 10 nm. The insulation layers 41a and the element forming sections 20, 30 define steps. The height of each step corresponds to the etching amount of the insulation from when the silicon oxide film 11 is removed to when the conductive film is patterned. Further, the height of the steps is determined so that the upper surfaces of the insulation layers 41 ultimately become flush with the upper surfaces of the element forming sections 20, 30, as shown in the state of FIG. 2. The insulation layers 41 formed in the element partitioning trenches 40 subsequent to the removal of the flattened silicon nitride film 12c and the silicon oxide film 11 are denoted with reference numerals 41b in FIG. 3f.

Referring to FIG. 2 and FIGS. 3d to 3f, steps are formed by the mask aligning trench 50 and the insulation layer 51 (51a, 51b). Accordingly, the mask aligning trench (steps) 50 may be used when positioning a mask on the semiconductor substrate 1 to pattern a conductive film or the like subsequent to the formation of element forming sections.

The preferred and illustrated embodiment has the advantages described below.

(1) The insulation layer 51 in the mask aligning trench 50 is below the upper edge of the walls of the mask aligning trench 50. Thus, the mask aligning trench 50 may be used as a mark on the semiconductor substrate 1. Subsequent to the formation of element partitions, the mask aligning trench 50 facilitates, for example, the positioning of a mask on the semiconductor substrate 1 when forming a conductive film.

(2) Referring to FIG. 3d, the selective etching of the relatively thick part of the silicon oxide film 14 forms the relatively thin insulation film 14'. This facilitates the flattening process. Simultaneously, the silicon oxide film 14 covering the mask aligning trench 50 is also selectively etched. Thus, the insulation layer 51a formed in the mask aligning trench 50 is lower than the top of the aligning trench 50. Accordingly, steps between the walls of the mask aligning trench 50 and the insulation layer 51a are easily formed.

(3) Rotary grinding is employed in the preferred embodiment. This flattens the element forming sections 20, 30 and the element partitions.

(4) The silicon nitride film 12a (12b, 12c) may be used as a mask for forming the element partitioning trenches 40 and the mask aligning trench 50. Further, the silicon nitride film 12a (12b, 12c) may be used as a protective film of the semiconductor substrate 1.

(5) The thickness of the flattened silicon nitride film 12c is adjusted by taking into consideration the amount of the insulation in the element partitioning trenches 40 that will be etched in subsequent processes. This forms insulation layers with the desired thickness.

(6) The mask aligning trench improves the accuracy for positioning a mask on the semiconductor substrate subsequent to the formation of the element partitioning sections.

(7) The mask aligning trench 50 is formed by forming the element partitioning trenches 40 and the insulation film 14 and by performing etching to flatten the substrate surface. Thus, an additional process for forming the mask aligning trench 50 is not necessary.

(8) The resist (protective mask) 15 is formed above the element partitioning trenches 40, which are filled by the insulation film 14. This permits the insulation in the mask aligning trench 50 to be selectively etched. Further, the insulation film 14 deposited on the element forming section 30 is also etched. Thus, the steps between the element forming section 30 and the element partitioning trenches 40 are relatively small. This facilitates flattening in subsequent steps.

(9) The insulation film 14 is applied after the formation of a coating (silicon nitride film 12b) having a predetermined pattern. Accordingly, the coating 12b protects the surface of the semiconductor substrate 1 during the depositing, etching, and flattening processes.

(10) The stress applied to the silicon substrate 1 is reduced by the silicon oxide film 11 (11') formed between the silicon nitride film 12a (12b, 12c) and the silicon substrate 1.

Further, steps are formed by the silicon oxide film 11 and the insulation 41a without substantially removing the silicon oxide film 11 when removing the silicon nitride film 12a (12b, 12c). The height of each step is substantially equal to the depth of the insulation 41a that is etched in subsequent processes. Therefore, the insulation 41b ultimately becomes generally flush with the surface of the semiconductor substrate 1.

It should be apparent to those skilled in the art that the present invention may be embodied in many other specific forms without departing from the spirit or scope of the invention. Particularly, it should be understood that the present invention may be embodied in the following forms.

The material of the mask used to form the element partitioning trench 40 and the mask aligning trench 50 is not limited to silicon nitride. Further, the mask may be removed prior to the implantation of the insulation.

The flattening of the semiconductor substrate may be performed through a process other than rotary grinding.

The etching technique, the film thickness, and the etching depth may be changed as required.

Elements other than the conductive film may be formed through photolithography, which is performed immediately after the formation of the element partitions.

The present examples and embodiments are to be considered as illustrative and not restrictive, and the invention is not to be limited to the details given herein, but may be modified within the scope and equivalence of the appended claims.

What is claimed is:

1. A method for manufacturing a semiconductor device, the method comprising:
    forming a silicon oxide film on an upper surface of a semiconductor substrate;
    forming a silicon nitride film on the silicon oxide film;
    forming an element partitioning trench and a mask aligning trench in the semiconductor substrate;
    simultaneously depositing a silicon oxide insulation in the element partitioning trench and the mask aligning trench by a chemical vapor deposition process consisting of high density plasma chemical vapor deposition, wherein no other insulation layer has been deposited by a plasma process in the trenches prior to the silicon oxide insulation being deposited;
    applying a protective mask on the silicon oxide insulation deposited in the element partitioning trench to fully cover the element partitioning trench;
    etching the silicon oxide insulation deposited in the mask aligning trench to remove some of the silicon oxide insulation while the silicon oxide insulation deposited in the element partitioning trench is covered by the protective mask so that the silicon oxide insulation deposited in the mask aligning trench has an upper surface located lower than the upper surface of the semiconductor substrate;
    removing the protective mask;
    flattening an upper surface of the semiconductor device; and
    selectively removing the silicon nitride film by etching, wherein after said etching, an upper portion of the silicon oxide insulation deposited in the element partitioning trench projects above the upper surface of the silicon oxide film by a controlled height;
    removing the silicon oxide film by etching to define a mask aligning step between the upper surface of the silicon oxide insulation deposited in the mask aligning trench and the upper surface of the semiconductor substrate;
    aligning a mask for patterning a conductive film with the semiconductor substrate using the mask aligning step; and then
    patterning the conductive film, wherein a predetermined etched amount of said upper portion of the silicon oxide insulation is removed during a period from when the silicon oxide film is etched to when the conductive film is patterned, and wherein said controlled height of said upper portion of the silicon oxide insulation is predetermined so that said controlled height is equal to said predetermined etched amount.

2. The method according to claim 1, wherein the step of forming the element partitioning trench and the mask aligning trench includes:
    forming a coating on the semiconductor substrate, wherein the coating has a pattern of openings corresponding to the element partitioning trench and the mark aligning trench; and
    etching the semiconductor substrate using the coating as a mask to form the element partitioning trench and the mask aligning trench, wherein the insulation depositing step includes depositing the insulation without removing the coating.

3. The method according to claim 2, wherein the flattening step is performed through rotary grinding, and the coating functions as a stopper.

4. The method according to claim 3, wherein the semiconductor substrate is a silicon substrate, the insulation is formed from silicon oxide, and the coating is formed from silicon nitride, the method further comprising the step of forming a silicon oxide film on the semiconductor substrate prior to the formation of the element partitioning trench and mask aligning trench, wherein the coating is formed on the silicon oxide film.

5. The method according to claim 1, wherein height difference between the upper surface of the insulation deposited in the mask aligning trench and the upper surface located lower than the upper surface of the semiconductor substrate is adjustable by said etching the insulation deposited in the mask aligning trench.

6. A method for manufacturing a semiconductor device, the method comprising the steps of:
    forming a silicon oxide film on an upper surface of a semiconductor substrate;
    forming a silicon nitride film on the silicon oxide film;
    partially removing the silicon nitride film and the silicon oxide film;
    forming an element partitioning trench and a mask aligning trench by etching the semiconductor substrate using a residue of the silicon nitride and silicon oxide films as a mask, wherein the element partitioning trench and the mask aligning trench have substantially the same depths;
    simultaneously depositing a first layer of insulation and a second layer of insulation in the element partitioning trench and in the mask aligning trench, respectively by a chemical vapor deposition process consisting of high density plasma chemical vapor deposition, wherein no other insulation has been deposited by a plasma process in the trenches prior to the insulation being deposited;
    coating the first insulation with a protective mask to fully cover the element partitioning trench;
    etching the second insulation while the first insulation is covered by the protective mask so that a first step is formed between the upper surface of the semiconductor substrate and an upper surface of the second insulation;
    removing the protective mask;
    flattening an upper surface of the semiconductor device; and
    selectively removing the silicon nitride film by etching, wherein after said etching an upper portion of the first insulation projects above the upper surface of the silicon oxide film by a controlled height;
    removing the silicon oxide film by etching to define a mask aligning step between the upper surface of the second insulation deposited and the upper surface of the semiconductor substrate;

aligning a mask for patterning a conductive film with the semiconductor substrate using the mask aligning step; and then patterning the conductive film, wherein a predetermined etched amount of said upper portion of the first insulation is removed during a period from when the silicon oxide film is etched to when the conductive film is patterned, and wherein said controlled height of said upper portion of the first insulation is predetermined so that said controlled height is equal to said predetermined etched amount.

7. The method according to claim 6, wherein the first insulation and the second insulation are made of the same material.

8. The method according to claim 6, wherein height of the first step is adjustable by said etching the second insulation.

9. A method for manufacturing a semiconductor device, the method comprising:

forming a silicon oxide film on an upper surface of a semiconductor substrate;

forming a silicon nitride film on the silicon oxide film;

forming an element partitioning trench and a mask aligning trench in the semiconductor substrate;

simultaneously depositing an insulation in the element partitioning trench and the mask aligning trench by a chemical vapor deposition process consisting of high density plasma chemical vapor deposition, the insulation directly contacting the semiconductor substrate;

applying a protective mask on the insulation deposited in the element partitioning trench to fully cover the element partitioning trench;

etching the insulation deposited in the mask aligning trench to remove some of the insulation while the insulation deposited in the element partitioning trench is covered by the protective mask so that the insulation deposited in the mask aligning trench has an upper surface located lower than the upper surface of the semiconductor substrate;

removing the protective mask;

flattening an upper surface of the semiconductor device;

selectively removing the silicon nitride film by etching, wherein after said etching, an upper portion of the insulation deposited in the element partitioning trench projects above the upper surface of the silicon oxide film by a controlled height;

removing the silicon oxide film by etching to define a mask aligning step between the upper surface of the insulation deposited in the mask aligning trench and the upper surface of the semiconductor substrate;

aligning a mask for patterning a conductive film with the semiconductor substrate using the mask aligning step; and then patterning the conductive film, wherein a predetermined etched amount of said upper portion of the insulation is removed during a period from when the silicon oxide film is etched to when the conductive film is patterned, and wherein said controlled height of said upper portion of the insulation is predetermined so that said controlled height is equal to said predetermined etched amount.

10. The method according to claim 9, wherein height difference between the upper surface of the insulation deposited in the mask aligning trench and the upper surface located lower than the upper surface of the semiconductor substrate is adjustable by said etching the insulation deposited in the mask aligning trench.

11. A method for manufacturing a semiconductor device, the method comprising the steps of:

forming a silicon oxide film on an upper surface of a semiconductor substrate;

forming a silicon nitride film on the silicon oxide film;

partially removing the silicon nitride film and the silicon oxide film;

forming, an element partitioning trench and a mask aligning trench by etching the semiconductor substrate using a residue of the silicon nitride and silicon oxide films as a mask, wherein the element partitioning trench and the mask aligning trench have substantially the same depths;

simultaneously depositing a first layer of insulation and a second layer of insulation in the element partitioning trench and in the mask aligning trench, respectively by a chemical vapor deposition process consisting of high density plasma chemical vapor deposition, the first layer of insulation and the second layer of insulation directly contacting the semiconductor substrate;

coating the first insulation with a protective mask to fully cover the element partitioning trench;

etching the second insulation while the first insulation is covered by the protective mask so that a first step is formed between an upper surface of the semiconductor substrate and an upper surface of the second insulation;

removing the protective mask; and selectively removing the silicon nitride film by etching, wherein after said etching, an upper portion of the first insulation projects above the upper surface of the silicon oxide film by a controlled height;

removing the silicon oxide film by etching to define a mask aligning step between the upper surface of the second insulation deposited and the upper surface of the semiconductor substrate;

aligning a mask for patterning a conductive film with the semiconductor substrate using the mask aligning step; and then patterning the conductive film, wherein a predetermined etched amount of said upper portion of the first insulation is removed during a period from when the silicon oxide film is etched to when the conductive film is patterned, and wherein said controlled height of said upper portion of the first insulation is predetermined so that said controlled height is equal to said predetermined etched amount.

12. The method according to claim 11, wherein height of the first step is adjustable by said etching the second insulation.

* * * * *